United States Patent
Midya et al.

(10) Patent No.: US 6,838,931 B2
(45) Date of Patent: Jan. 4, 2005

(54) POWER AMPLIFIER CIRCUIT AND METHOD USING BANDLIMITED SIGNAL COMPONENT ESTIMATES

(75) Inventors: Pallab Midya, Palatine, IL (US); John Grosspietsch, Libertyville, IL (US); Michael Washington, Stone Mountain, GA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/844,123

(22) Filed: May 12, 2004

(65) Prior Publication Data

US 2004/0208262 A1 Oct. 21, 2004

Related U.S. Application Data

(62) Division of application No. 10/334,843, filed on Dec. 31, 2002.

(51) Int. Cl.[7] .................................................. H03F 3/38
(52) U.S. Cl. ........................................ 330/10; 330/129
(58) Field of Search .......................... 330/10, 136, 129, 330/297; 375/238, 269, 298, 329, 308; 332/144, 149

(56) References Cited

U.S. PATENT DOCUMENTS 5,990,735 A * 11/1999 Sigmon et al. ............... 330/10
6,175,273 B1 * 1/2001 Sigmon et al. ............... 330/10
6,300,826 B1 * 10/2001 Mathe et al. .................. 330/10

* cited by examiner

Primary Examiner—Henry Choe
(74) Attorney, Agent, or Firm—Lawrence Chapa

(57) ABSTRACT

A power amplifier circuit for receiving a variable envelope input signal and for producing an amplified output signal is provided. The power amplifier circuit includes an envelope approximation circuit, an envelope amplifier circuit, a phasor approximation circuit, a quadrature modulation circuit, and a power amplifier. The envelope approximation circuit receives the variable envelope input signal and produces a bandlimited estimated envelope signal, corresponding to the amplitude of the variable envelope input signal. The bandlimited estimated envelope signal is then amplified by an envelope amplifier circuit. The amplified envelope signal is then coupled to the supply input of the power amplifier. The phasor approximation circuit receives the variable envelope input signal and produces a bandlimited estimated phasor signal. The quadrature modulation circuit receives the estimated phase signal and produces a modulated phase signal. The modulated phase signal is then coupled to the signal input of the power amplifier. The power amplifier then produces an amplified output signal.

29 Claims, 5 Drawing Sheets

—PRIOR ART—

—PRIOR ART—

POWER AMPLIFIER CIRCUIT AND METHOD USING BANDLIMITED SIGNAL COMPONENT ESTIMATES

CROSS REFERENCE TO RELATED APPLICATIONS

This application is a division of U.S. patent application Ser. No. 10/334,843, filed Dec. 31, 2002.

FIELD OF THE INVENTION

The present invention relates generally to power amplifier circuits, and more particularly, to an envelope elimination and restoration type power amplifier for amplifying a variable envelope input signal using bandlimited signal component estimates.

BACKGROUND OF THE INVENTION

Several types of digital modulation schemes used in the transmission of radio signals, like Quadrature Amplitude Modulation (QAM) and Quadrature Phase Shift Keying (QPSK) require the use of variable envelope radio frequency signals. The generation and amplification, especially power amplification, of variable envelope radio frequency signals tends to be less efficient and consumes a large percentage of the power in a two way radio. In order to accommodate the amplification of signals having a variable envelope, a power amplifier, which maintains linearity over a wider operating range needs to be used. Most power amplifiers can be tuned to be more efficient at a particular point along the required operating range, often at the expense of efficiency at other points along the operating range.

However some amplifiers can be adapted to operate more efficiently over wider operating ranges than other amplifiers. One such amplifier is an Envelope Elimination and Restoration (EER) amplifier. An EER amplifier generates a signal component representative of a input signal's envelope and couples the signal to the Supply input of a power amplifier. The EER amplifier will also generate a signal component representative of the input signal's phase and couples the signal to the signal input of the power amplifier. As a result, the component of the input signal representative of the signal's phase will have it's amplitude adjusted corresponding to the value of the component of the input signal representative of the signal's envelope, which is coupled to the supply input of the power amplifier.

However, EER amplifiers have seen limited use, because EER amplifiers have significant concerns regarding linearity and bandwidth. While a bandlimited RF signal will generally have baseband signal components in the cartesian domain that are bandlimited, generally the amplitude and phase component of the bandlimited RF signal will not be bandlimited. As a result in order to accommodate non-bandlimited signal components, the bandwidth requirements of the power amplifier system increases greatly. Additionally linearity problems may arise from amplitude modulation to phase modulation distortion due to nulls in the power supply.

The present inventors have recognized that if the EER amplifier can be accommodated with bandlimited approximations of the amplitude and phase/frequency, the substantial bandwidth increases to the system are no longer necessary, and steps can be taken to adjust the approximation algorithm, to incorporate a favorable predistortion, which accommodates the linearity concerns.

SUMMARY OF THE INVENTION

The present invention provides a power amplifier circuit for receiving a variable envelope input signal and for producing an amplified output signal. The power amplifier circuit includes an envelope approximation circuit, an envelope amplifier circuit, a phasor approximation circuit, a quadrature modulation circuit, and a power amplifier. The envelope approximation circuit receives the variable envelope input signal and produces a bandlimited estimated envelope signal, corresponding to the amplitude of the variable envelope input signal. The bandlimited estimated envelope signal is then amplified by an envelope amplifier circuit. The amplified envelope signal is then coupled to the supply input of the power amplifier.

The phasor approximation circuit receives the variable envelope input signal and produces a bandlimited estimated phasor signal. The quadrature modulation circuit receives the estimated phase signal and produces a modulated phase signal. The modulated phase signal is then coupled to the signal input of the power amplifier. The power amplifier then produces an amplified output signal.

In at least one embodiment the estimated amplitude signal and the estimated phase signal are polynomial approximations of the corresponding amplitude and phase signals.

In a further embodiment a bandlimited approximation of frequency is determined as opposed to a bandlimited approximation of phase, and a frequency modulation circuit receives the estimated frequency signal and produces a modulated frequency signal, which is then coupled to the signal input of the power amplifier.

The present invention further provides a method of amplifying a variable envelope input signal. The method includes receiving a variable envelope input signal having at least a pair of baseband signal components. A bandlimited approximation of the amplitude of the variable envelope input signal is then computed from the baseband signal components of the variable envelope input signal. The approximation of the amplitude is then amplified, and the amplified approximation of the amplitude is coupled to the supply input of a power amplifier. The method further is includes computing a bandlimited approximation of the phase of the variable envelope input signal from the baseband signal components of the variable envelope input signal. A phase modulated signal, based upon the computed approximation of the phase is then generated. The phase modulated signal is then applied to the signal input of the power amplifier, and an amplified output signal is generated.

Similar to the power amplifier circuit, in an alternative embodiment of the method, a bandlimited estimation of a signal's frequency can be used, in conjunction with the generation of a frequency modulated signal for applying to the signal input of a power amplifier.

These and other features, and advantages of this invention are evident from the following description of one or more preferred embodiments of this invention, with reference to the accompanying drawings.

DETAILED DESCRIPTION OF THE PREFERRED EMBODIMENT(S)

Figure 1:
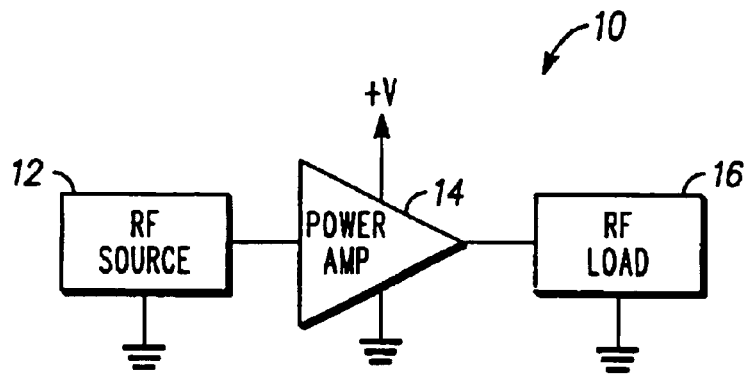
FIG. 1 is a previously known block diagram of a radio transmitter.

While the present invention is susceptible of embodiment in various forms, there is shown in the drawings and will hereinafter be described presently preferred embodiments with the understanding that the present disclosure is to be considered an exemplification of the invention and is not intended to limit the invention to the specific embodiments illustrated.

FIG. 1 illustrates a previously known block diagram of a radio transmitter 10, which is suitable for use in a wireless communication device, such as a radio telephone. The radio transmitter 10 includes an RF source 12, which produces a suitably modulated radio frequency signal. The RF source is coupled to a power amplifier 14, which receives the radio frequency signal, and amplifies the same. The output of the power amplifier 14 is then supplied to an RF load 16 coupled to the output of the power amplifier 14. In many instances the RF load 16 is an antenna designed to radiate the radio frequency signal.

Figure 2:
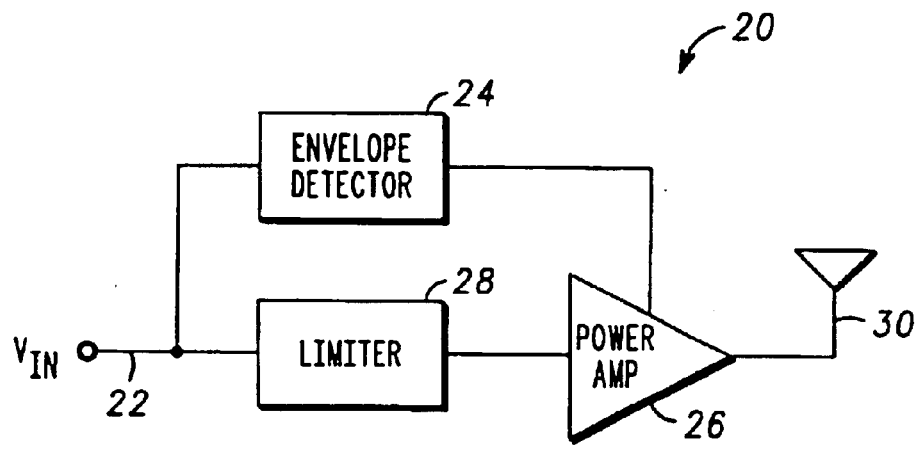
FIG. 2 is a block diagram of a prior envelope elimination and restoration power amplifier circuit.

FIG. 2 illustrates an example of a block diagram of a prior envelope elimination and restoration (EER) power amplifier circuit 20. The prior envelope elimination and restoration power amplifier circuit 20 includes an input 22 for receiving a signal to be amplified. An envelope detector 24 receives the signal to be amplified and produces a signal corresponding to the envelope of the received signal. The signal corresponding to the envelope of the received signal is then supplied to the source input of a power amplifier 26. The signal to be amplified is similarly received by a limiter circuit 28, which essentially strips the amplitude information from the signal. The resulting signal largely contains the phase and/or frequency component of the originally received signal. The signal containing the phase and/or frequency component is then supplied to the signal input of the power amplifier 26. The output of the power amplifier 26 is coupled to an RF load, such as an antenna 30. In the present circuit, the power amplifier 26 essentially functions as a multiplier.

While it is not absolutely necessary for the amplitude and the phase components of the signal to be bandlimited, the output of the power amplifier 26 needs to be. Consequently, if amplitude and phase components of a signal, which were not bandlimited were used, then signal components would need to be constructed with extremely high fidelity, thereby greatly increasing the bandwidth requirements, in the previously known version of the EER amplifier circuit 20.

Figure 3:
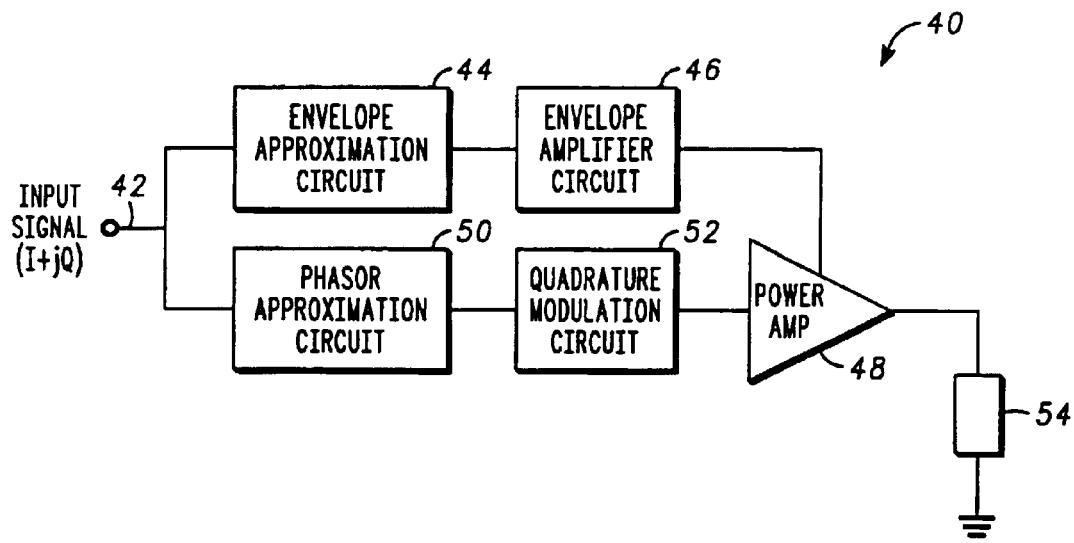
FIG. 3 is a block diagram of an envelope elimination and restoration power amplifier circuit, in accordance with the present invention.

In the EER amplifier circuit, in accordance with the present invention, the approximated phase and amplitude signal components are constructed such that they are individually bandlimited. Correspondingly, the output of the power amplifier, which corresponds to the product of these two signals is implicitly or inherently bandlimited. A first embodiment of an EER amplifier circuit 40, in accordance with the present invention, is illustrated in FIG. 3. The amplifier circuit 40 receives at an input 42 an input signal having at least a pair of baseband signal components. In the illustrated embodiment, the baseband signal components include an inphase and quadrature signal.

An envelope approximation circuit 44 produces an implicitly bandlimited estimated envelope signal. The estimated envelope signal is provided to an envelope amplifier circuit 46, which is coupled to the envelope approximation circuit 44. The envelope amplifier circuit 46 produces an amplified envelope signal, which is supplied to the source input of a power amplifier 48.

A phasor approximation circuit 50 produces an implicitly bandlimited estimated phasor signal. The estimated phasor signal is then provided to a quadrature modulation circuit 52, which produces a modulated phase signal. The modulated phase signal is supplied to the signal input of the power amplifier 48. The power amplifier then produces an amplified output signal, which is then supplied to a load 54.

Figure 4:
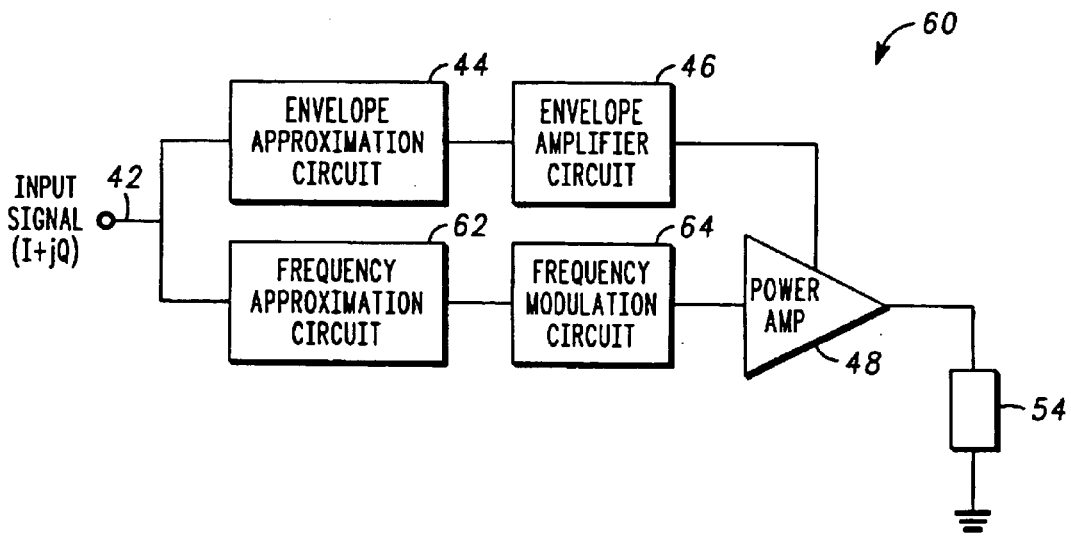
FIG. 4 is a block diagram of an alternative embodiment of an envelope elimination and restoration power amplifier circuit, in accordance with the present invention.

FIG. 4 illustrates an alternative embodiment of an EER amplifier circuit 60, which is similar to the EER amplifier circuit 40, illustrated in FIG. 3, with the exception that as opposed to a phase estimate of the input signal, a frequency estimate is produced by the frequency approximation circuit 62, which is then modulated by a frequency modulation circuit 64. The output of the frequency modulation circuit 64, corresponding to a frequency modulated signal, is then supplied to the signal input of the power amplifier 48.

In at least one embodiment, the EER power amplifier circuits 40 and 60 incorporate an envelope amplifier circuit 46, which is consistent with a power amplifier circuit described in Midya, U.S. Pat. No. 5,905,407, assigned to Motorola, Inc., the disclosure of which is incorporated herein by reference, where a more detailed discussion of the circuit can be found. A block diagram of a representative power amplifier circuit from the referenced prior patent is reproduced as FIG. 5 in the present application.

Figure 5:
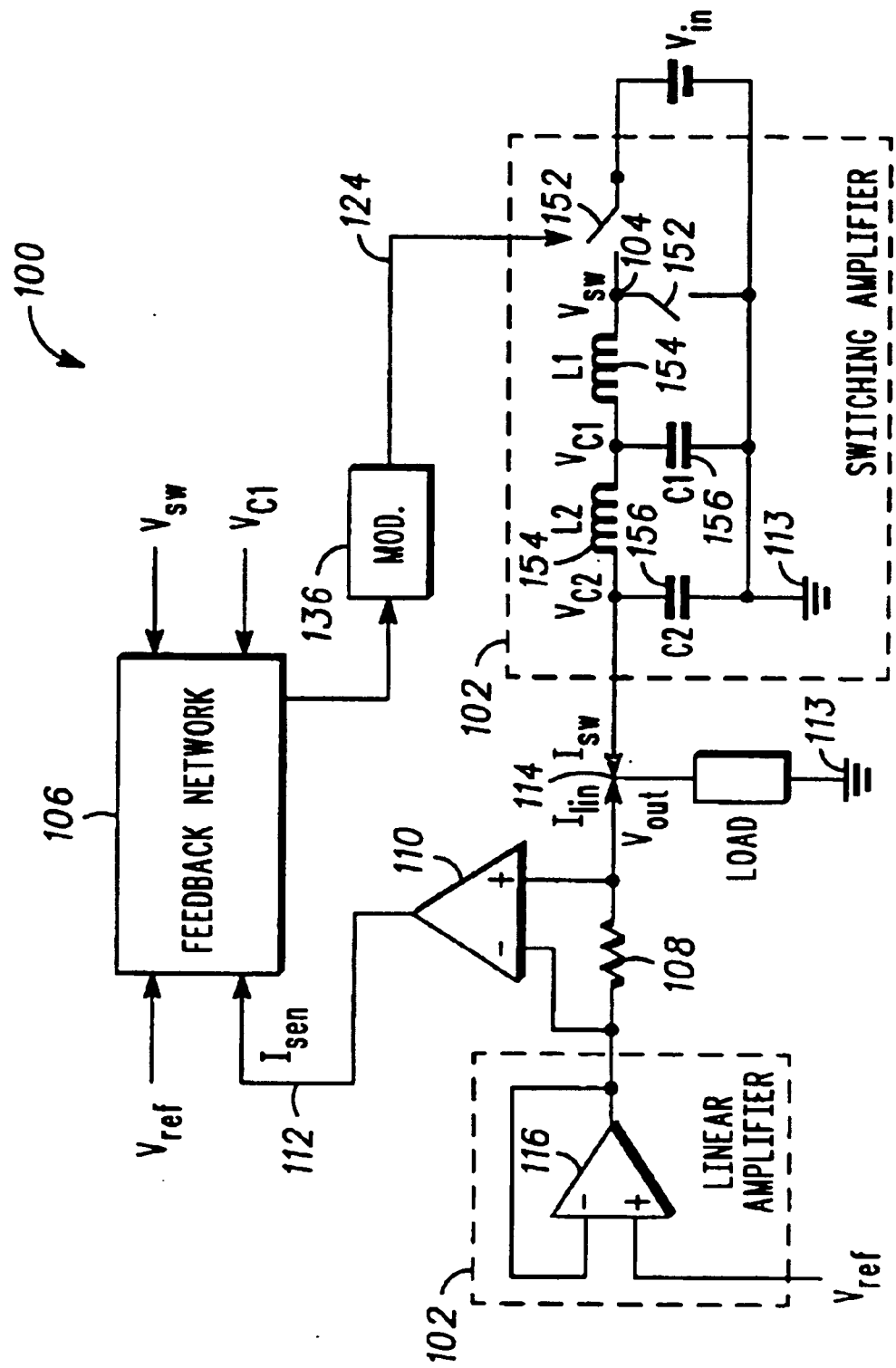
FIG. 5 is a more detailed circuit schematic of an envelope amplifier circuit, which is suitable for use in either of the envelope elimination and restoration power amplifier circuits illustrated in FIGS. 3 and 4

As illustrated in FIG. 5, the power amplifier 100 includes a switching amplifier 102 for delivering a switching amplifier output current $I_{SW}$ to an output node 114. The switching amplifier 102 preferably comprises two switches 152, which operate in a complementary fashion, one switch 152 being closed, while the other switch 152 is open, and vice versa, with a duty cycle controlled by the modulator 136, which in the illustrated embodiment is a pulse width modulator (PWM) circuit. The switching amplifier 102 includes a two-stage filter comprising a pair of inductors 154 coupled between a switching node 104 (which serves as the input node of the two-stage filter) and the output node 114. The filter further comprises a pair of capacitors 156 coupled between the output node 114 and a common node 113.

The switching amplifier is coupled to the output 124 of the modulator 136. The input of the modulator 136 is coupled to the feedback network 106. The feedback network 106 is preferably coupled to the switching node 104 of the switching amplifier for monitoring the voltage $V_{SW}$ present on the switching node 104. The feedback network is additionally coupled to reference signal $V_{ref}, I_{sen}$ and $V_{C1} \cdot I_{sen}$ is supplied from current sense output 112, which is produced from differential amplifier 110 having inputs on alternative sides of a sense resistor 108. The differential amplifier 110 senses the current supplied by linear amplifier 102, which includes a power operational amplifier 116. The power amplifier circuit 100, illustrated in FIG. 5, serves as a suitable envelope amplifier circuit 46.

The implicitly bandlimited estimated envelope signal produced by the envelope approximation circuit 44, the implicitly bandlimited estimated phasor signal produced by the phasor approximation circuit 50, and the implicitly bandlimited estimated frequency signal produced by the frequency approximation circuit 62, in at least one embodiment, each correspond to a polynomial approximation. More specifically, the estimated envelope signal is a polynomial approximation of the square root of the sum of the square of the inphase component of the received signal and the square of the quadrature component of the received signal. The estimated phasor signal is a polynomial approximation of the inverse of the square root of the sum of the square of the inphase component of the received signal and the square of the quadrature component of the received signal. The estimated frequency signal is a polynomial approximation of the inverse of the sum of the square of the inphase component of the received signal and the square of the quadrature component of the received signal.

In at least one embodiment the polynomials can be selected so as to provide active cancellation in the near out of band region, thereby limiting spill over power into adjacent channels. Furthermore, by controlling the order of the highest order term, one can balance the accuracy of the approximation with the degree to which the estimate is bandlimited. Polynomial approximations having a highest order term, which is lower will be less accurate, but will be more bandlimited. Furthermore real time computations will likely be easier for a polynomial approximation having a highest order term, which is lower.

In deriving a suitable polynomial approximation for the first embodiment of the envelope elimination and restoration power amplifier circuit, illustrated in FIG. 3, the signal amplitude is approximated as being approximately equivalent to the supply voltage, where supply voltage is approximately equal to $$V = A(r^2+Q^2) = \sqrt{(r^2+Q^2)}$$

a suitable polynomial expansion for the square root of a number includes $$A(r^2+Q^2) = a_0 + a_2(r^2+Q^2) + a_4(r^2+Q^2)^2$$

the coefficients for the individual terms of the polynomial then can be determined by fitting the estimated polynomial curve with the value of the real square root. By minimizing the square of the differences over the expected range of values coefficients can be determined, which minimize the difference between the estimated result determined using the polynomial and the real value.

$$J = \sum_{i=1}^{n} \left( \sum_{ia=1}^{na} a_{2(ia-1)}(x_i)^{2(ia-1)} - x_i \right)^2$$

A minimum deviation value can be determined by solving for when the derivative of the square of the differences is equal to zero.

$$\frac{dJ}{da_{2k}} = \sum_{i=1}^{n} 2\left( \sum_{ia=1}^{na} a_{2(ia-1)}(x_i)^{2(ia-1)} - x_i \right)(x_i)^{2k} = 0$$

Solving the above equation for each coefficient term through the highest order of the polynomial equation, will supply a set of simultaneous equations, which is equal to the number of the highest order term of the polynomial. Using a matrix reduction a value for the coefficients of each of the terms in the polynomial, which minimizes the deviation uniformly across all values can be determined. If one were interested in minimizing adjacent channel noise, the deviation could be distributed less uniformly, which might allow for more noise in the close in spectrum and less noise in the far out spectrum. One way to accomplish this is to minimize the time derivative of the deviation.

A similar approach is used to determine the appropriate polynomial for the phase signal. The phase signal has been estimated as being approximate to $$\phi = (I+jQ)(B(r^2+Q^2))$$

which is approximately equivalent to the inverse of the square root of the sum of the square of the inphase signal component of the received signal and the square of the quadrature signal component of the received signal. Consequently, a suitable polynomial function, which can be used to produce an estimate is $$B(r^2+Q^2) = b_0 + b_2(r^2+Q^2) + b_4(r^2+Q^2)^2 + b_6(r^2+Q^2)^3 + b_8(r^2+Q^2)^4$$

A minimum deviation can then be found, which will be used to compute a suitable set of coefficients for each of the terms in the polynomial expression. In the present instance, because the phase approximation can affect amplitude in addition to phase, a minimum deviation, which additionally takes into account both phase and amplitude can be useful.

$$I'+jQ' = V\phi = A(r^2+Q^2)(I+jQ) (B(r^2+Q^2))$$

$$J = \sum_{i=1}^{n} (|I'+jQ'|-|I+jQ|)^2 = \sum_{i=1}^{n} \left( V_i x_i \sum_{ib=1}^{nb} b_{2(ib-1)}(x_i)^{2(ib-1)} - x_i \right)^2$$

A minimum deviation value can be determined by solving for when the derivative of the square of the differences is equal to zero.

$$\frac{dJ}{db_{2k}} = 2 \sum_{i=1}^{n} \left( V_i x_i \sum_{ib=1}^{nb} b_{2(ib-1)}(x_i)^{2(ib-1)} - x_i \right) V_i x_i (x_i)^{2k} = 0$$

The resulting set of equations can then be used to solve for each of the coefficients. Similar to above, it is further possible, if desired, to weight the deviation uniformly, or in any manner appropriate.

The above embodiment is well suited to modulation formats, which might require a true radio frequency null, such as CDMA.

In the second embodiment illustrated in FIG. 4, the analysis for determining a suitable polynomial approximation for producing a bandlimited estimated envelope signal is the same, as above. However the polynomial approximation for producing a bandlimited estimated frequency signal is different than the polynomial approximation of the phase used in conjunction with quadrature modulator of FIG. 3. A polynomial approximation for estimating frequency, for use with the frequency modulater of FIG. 4 can be determined as follows. Specifically, frequency is a time derivative of phase. A suitable estimation for phase is $$\varphi = \mathrm{Tan}^{-1}\left(\frac{Q}{I}\right)$$

Consequently, taking the time derivative of the equation for phase produces $$\dot{\varphi} = \left(\frac{I\dot{Q} - Q\dot{I}}{I^2 + Q^2}\right)$$

which is suitable for use as an estimate for frequency. Namely, the above representation corresponds to the inverse of the square of the sum of the square of the inphase component and the spare of the quadrature component. This results in a suitable polynomial form as follows $$\dot{\varphi} \approx ((I\dot{Q} - Q\dot{I})B(r^2+Q^2) = (I\dot{Q}-Q\dot{I})[b_0+b_2(r^2+Q^2)+b_2(r^2+Q^2)+b_4(r^2+Q^2)^2]$$

Because the frequency is orthogonal to the amplitude, it may not be helpful to take into account the determined estimation for envelope, when determining the appropriate coefficients for the selected polynomial function for frequency. Using the same difference of squares techniques produces the following equation $$J = \sum_{i=1}^{n} \left( \sum_{ib=1}^{nb} b_{2(ia-1)}(I(i)^2 + Q(i)^2)^{(ib-1)} - (I(i)^2 + Q(i)^2)^{-1} \right)^2$$

deriving an equation from which coefficients for the terms can be determined for minimizing the differential between the estimated value and the real value, which is uniformly weighted across all frequency values produces the equation $$\frac{dJ}{db_{2k}} = \sum_{i=1}^{n} 2\left(\sum_{ib=1}^{nb} b_{2(ib-1)}(I(i)^2 + Q(i)^2)^{(ib-1)} - (I(i)^2 + Q(i)^2)^{-1}\right)(I(i)^2 + Q(i)^2)^k = 0$$

the above equation produces a set of equations, which includes a corresponding number of variable, that when solved, will produce a suitable set of values for the coefficients of the terms in the above noted polynomial.

The polynomials estimations produce bandlimited estimations for amplitude, phase and frequency, which enable an envelope elimination and restoration power amplifier to be used, while avoiding many of the issues, which have detracted from their previous use.

As described, herein, the power amplifier circuit is suitable for use where other power amplifiers circuits have previously been used, including in a transmitter used as part of a wireless telephone, or other similar device.

Figure 6:
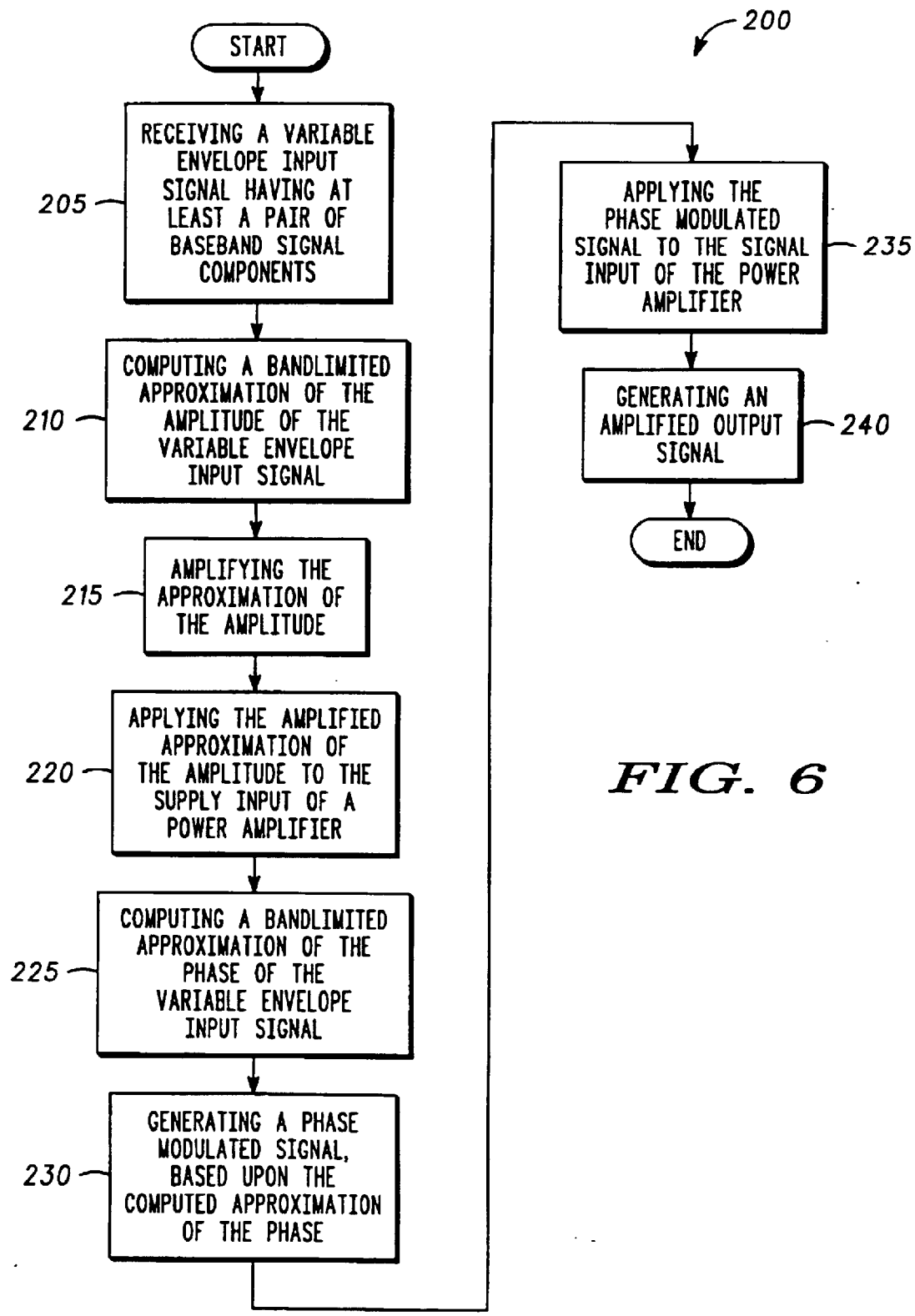
FIG. 6 is a flow diagram of a method of amplifying a variable envelope input signal, in accordance with the present invention.

The present invention further provides a method 200 for amplifying a variable envelope input signal. As illustrated in FIG. 6, the method provides for receiving 205 a variable envelope input signal having at least a pair of baseband signal components. A bandlimited approximation of the amplitude of the variable envelope input signal is then computed 210. The approximation of the amplitude is then amplified 215, and applied to the supply input of a power amplifier 220. A bandlimited approximation of the phase of the variable envelope input signal is then computed 225. From the computed approximation of the phase, a phase modulated signal is generated 230. The phase modulated signal is then applied 235 to the signal input of the power amplifier, and an amplified output signal is generated 240.

Figure 7:
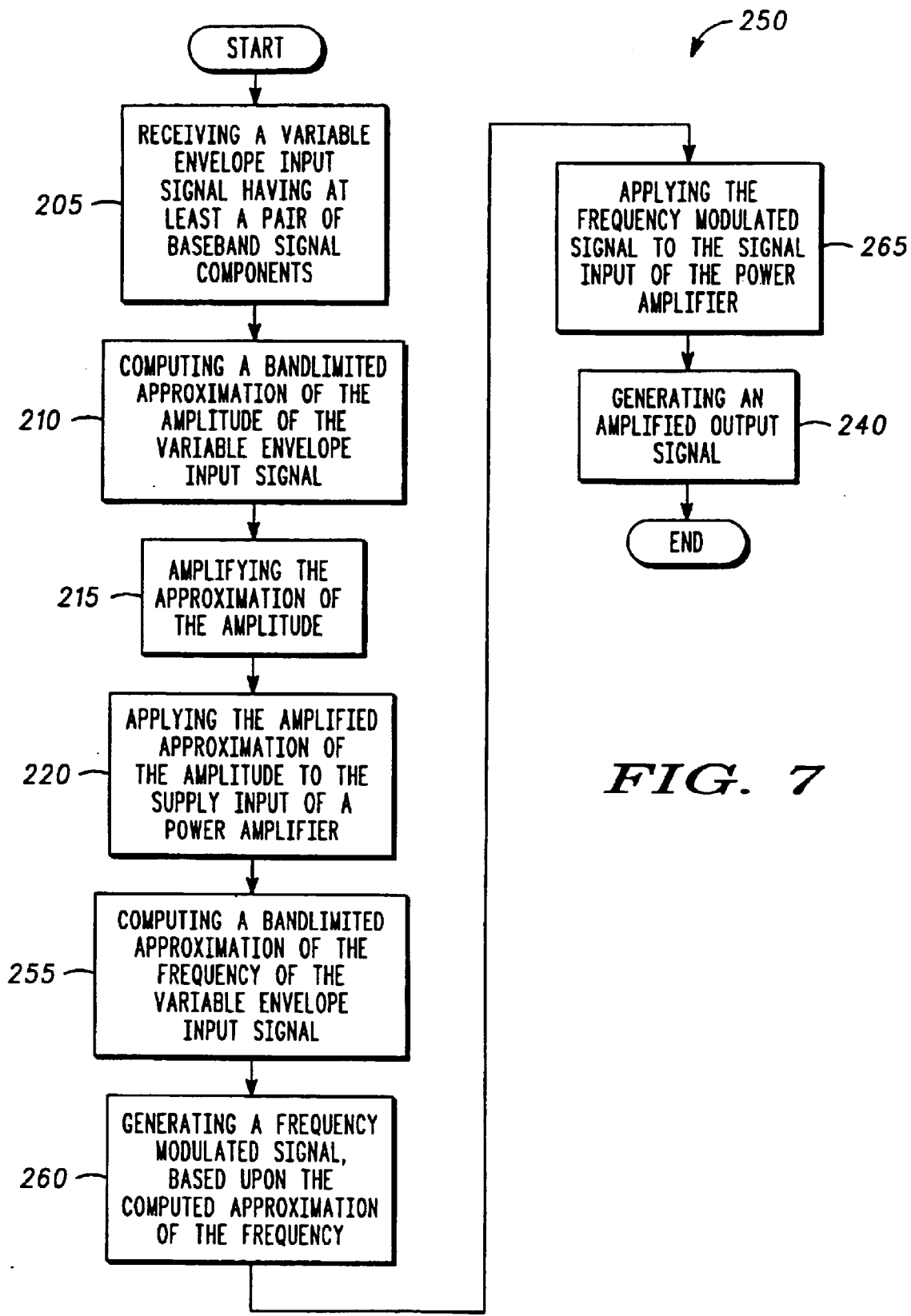
FIG. 7 is an alternative embodiment of a flow diagram of a method of amplifying a variable envelope input signal, in accordance with the present invention.

The method illustrated in FIG. 7 differs from the method illustrated in FIG. 6, in that, instead of computing a phase estimate of the variable envelope input signal, a bandlimited approximation of the frequency of the variable envelope input signal is computed 255. A frequency modulated signal is then generated 260 from the frequency approximation, and then applied to the signal input of the power amplifier 265.

While the preferred embodiments of the invention have been illustrated and described, it is to be understood that the invention is not so limited. Numerous modifications, changes, variations, substitutions and equivalents will occur to those skilled in the art without departing from the spirit and scope of the present invention as defined by the appended claims.

What is claimed is:

1. A power amplifier circuit for receiving a variable envelope input signal and producing an amplified output signal, the power amplifier circuit comprising:
   an input for receiving the variable envelope input signal having at least a pair of baseband signal components;
   an envelope approximation circuit, coupled to said input, for receiving the variable envelope input signal and for producing a bandlimited estimated envelope signal, corresponding to the amplitude of the variable envelope input signal;
   an envelope amplifier circuit, coupled to the envelope approximation circuit, for receiving the estimated envelope signal and for producing an amplified envelope signal;
   a frequency approximation circuit, coupled to said input, for receiving the variable envelope input signal and for producing a bandlimited estimated frequency signal;
   a frequency modulation circuit, coupled to the frequency approximation circuit, for receiving the estimated frequency signal and for producing a modulated frequency signal; and
   a power amplifier including a supply input coupled to the envelope amplifier circuit for receiving the amplified envelope signal, a signal input coupled to the frequency modulation circuit for receiving the modulated frequency signal, for producing an amplified output signal.

2. The amplifier circuit of claim 1 wherein the variable envelope input signal is a variable envelope radio frequency (RF) signal.

3. The amplifier circuit of claim 1 wherein the pair of baseband signal components include an inphase signal and a quadrature signal.

4. The amplifier circuit of claim 1 wherein the bandlimited estimated envelope signal is a polynomial approximation of the amplitude of the variable envelope input signal.

5. The amplifier circuit of claim 4 wherein the baseband signal components include an inphase signal and a quadrature signal and wherein the polynomial approximation of the signal amplitude includes an approximation of the square root of the sum of the inphase signal squared and the quadrature signal squared.

6. The amplifier circuit of claim 5 wherein the polynomial approximation of the signal amplitude includes a predetermined number of the highest order terms.

7. The amplifier circuit of claim 6 wherein the polynomial approximation of the signal phase includes the three or fewer highest order terms.

8. The amplifier circuit of claim 6 wherein the polynomial approximation of the signal phase includes the two or more highest order terms.

9. The amplifier circuit of claim 1 wherein the bandlimited estimated frequency signal is a polynomial approximation of the signal frequency.

10. The amplifier circuit of claim 9 wherein the baseband signal components include an inphase signal and a quadrature signal and wherein the polynomial approximation of the signal frequency includes an approximation of the inverse of the square of the sum of the inphase signal squared and the quadrature signal squared.

11. The amplifier circuit of claim 10 wherein the polynomial approximation of the signal frequency includes a predetermined number of the highest order terms.

12. The amplifier circuit of claim 11 wherein the polynomial approximation of the signal frequency includes the three or fewer highest order terms.

13. The amplifier circuit of claim 11 wherein the polynomial approximation of the signal frequency includes the two or more highest order terms.

14. The amplifier circuit of claim 1 wherein the power amplifier is a class C power amplifier.

15. The amplifier circuit of claim 1 wherein the output of the power amplifier is coupled to a load.

16. The amplifier circuit of claim 1 wherein the amplified output signal corresponds to a variable envelope input signal, which has been linearly amplified.

17. The amplifier circuit of claim 1 wherein the envelope amplifier circuit includes:
a switching amplifier,
a modulator coupled to the switching amplifier for generating a switching control signal for controlling the switching amplifier,
a linear amplifier coupled to a reference voltage,
a feedback network coupled to the modulator for controlling the modulator, the feedback network further coupled for receiving the reference voltage, the sensed current level output from the linear amplifier, an interval voltage level of the switching amplifier, and the switching control signal produced by the modulator, and
an output coupled to the output of the switching amplifier and the linear amplifier.

18. A method of amplifying a variable envelope input signal comprising:
receiving a variable envelope input signal having at least a pair of baseband signal components;
computing a bandlimited approximation of the amplitude of the variable envelope input signal from the baseband signal components of the variable envelope input signal;
amplifying the approximation of the amplitude;
applying the amplified approximation of the amplitude to the supply input of a power amplifier;
computing a bandlimited approximation of the frequency of the variable envelope input signal from the baseband signal components of the variable envelope input signal;
generating a frequency modulated signal, based upon the computed approximation of the frequency;
applying the frequency modulated signal to the signal input of the power amplifier; and
generating an amplified output signal.

19. The method of amplifying a variable envelope input signal of claim 18 wherein the baseband signal components include an inphase component and a quadrature component.

20. The method of amplifying a variable envelope input signal of claim 19 wherein computing a band-limited approximation of the amplitude includes solving a polynomial approximation of the amplitude.

21. The method of amplifying a variable envelope input signal of claim 20 wherein the polynomial approximation of the amplitude includes an approximation of the square root of the sum of the inphase signal squared and the quadrature signal squared.

22. The method of amplifying a variable envelope input signal of claim 20 wherein solving a polynomial approximation of the frequency includes precomputing the values of the polynomial coefficients by minimizing the cumulative difference between the band-limited approximation of the frequency and the actual value of the frequency, and determining the value of the polynomial, in real time, based upon the received values of the inphase and the quadrature signal components.

23. The method of amplifying a variable envelope signal of claim 22 wherein minimizing the cumulative difference includes weighting the difference uniformly over the spectrum.

24. The method of amplifying a variable envelope signal of claim 22 wherein minimizing the cumulative difference includes minimizing the cumulative time derivative of the difference.

25. The method of amplifying a variable envelope input signal of claim 19 wherein computing a band-limited approximation of the frequency includes solving a polynomial approximation of the frequency.

26. The method of amplifying a variable envelope input signal of claim 25 wherein the polynomial approximation of the frequency includes an approximation of the inverse of the square of the sum of the inphase signal squared and the quadrature signal squared.

27. The method of amplifying a variable envelope input signal of claim 25 wherein solving a polynomial approximation of the frequency includes precomputing the values of the polynomial coefficients by minimizing the cumulative difference between the band-limited approximation of the frequency and the actual value of the frequency, and determining the value of the polynomial, in real time, based upon the received values of the inphase and the quadrature signal components.

28. The method of amplifying a variable envelope signal of claim 27 wherein minimizing the cumulative difference includes weighting the difference uniformly over the spectrum.

29. The method of amplifying a variable envelope signal of claim 27 wherein minimizing the cumulative difference includes minimizing the cumulative time derivative of the difference.

* * * * *